US006841448B2

(12) United States Patent
Gehring et al.

(10) Patent No.: US 6,841,448 B2
(45) Date of Patent: Jan. 11, 2005

(54) METHOD FOR FABRICATING EMBEDDED NONVOLATILE SEMICONDUCTOR MEMORY CELLS

(75) Inventors: Oliver Gehring, Dresden (DE);
Wolfram Langheinrich, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/045,278

(22) Filed: Jan. 14, 2002

(65) Prior Publication Data

US 2002/0094646 A1 Jul. 18, 2002

(30) Foreign Application Priority Data

Jan. 12, 2001 (DE) .......................... 101 01 270

(51) Int. Cl.[7] .................. H01L 21/8239; H01L 21/321
(52) U.S. Cl. .................. 438/275; 438/587; 438/981
(58) Field of Search .................. 438/258, 275–279, 438/587, 981

(56) References Cited

U.S. PATENT DOCUMENTS

| 5,395,778 A | 3/1995 | Walker |
| 5,723,355 A | 3/1998 | Chang et al. |
| 6,074,915 A | 6/2000 | Chen et al. |
| 6,121,087 A | 9/2000 | Mann et al. |
| 6,194,036 B1 * | 2/2001 | Babayan et al. ............ 427/563 |
| 6,261,964 B1 * | 7/2001 | Wu et al. ................... 438/705 |
| 6,316,293 B1 * | 11/2001 | Fang ......................... 438/142 |

FOREIGN PATENT DOCUMENTS

| GB | 2 347 016 A | 8/2000 |
| WO | WO 97/36332 | 10/1997 |

OTHER PUBLICATIONS

Ghandi, VLSI Fabrication Principles: Silicon and Gallium Arsenide, 1994, John Wiley and Sons, Inc., New York, 2nd edition, pp. 589, 620.*

* cited by examiner

*Primary Examiner*—Long Pham
*Assistant Examiner*—Marcos D. Pizarro-Crespo
(74) *Attorney, Agent, or Firm*—Laurence A. Greenberg; Werner H. Stemer; Ralph E. Locher

(57) ABSTRACT

A method for fabricating embedded nonvolatile semiconductor memory cells is described. The method includes forming a first insulating layer on a substrate having a high-voltage region, a memory region and a logic region. The first insulating layer is removed in the memory region, and a second insulating layer is formed. A charge-storing layer is formed and patterned along with a third insulating layer. The first to third insulating layers and also the charge-storing layer are removed in the logic region. A fourth insulating layer is formed and a conductive control layer is formed and patterned.

10 Claims, 4 Drawing Sheets

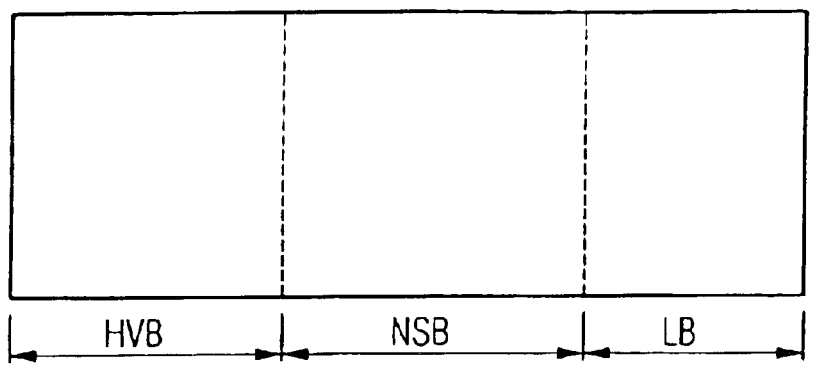
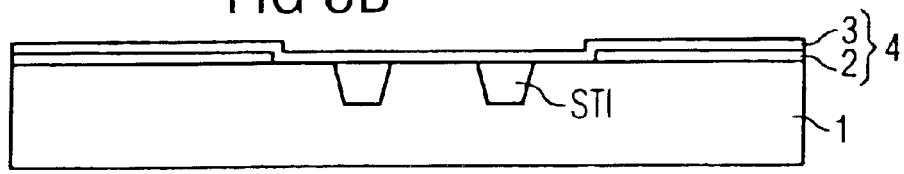
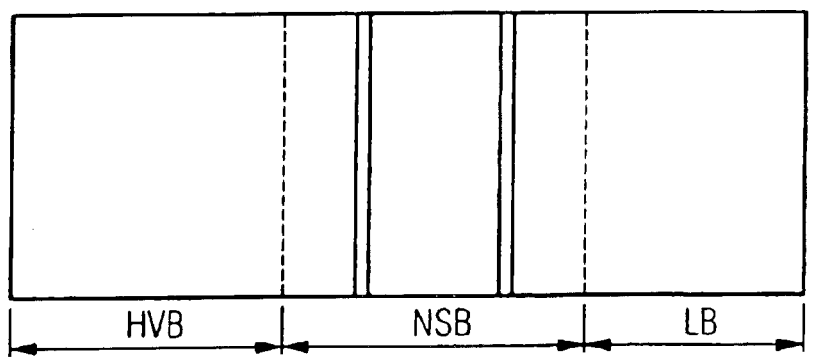
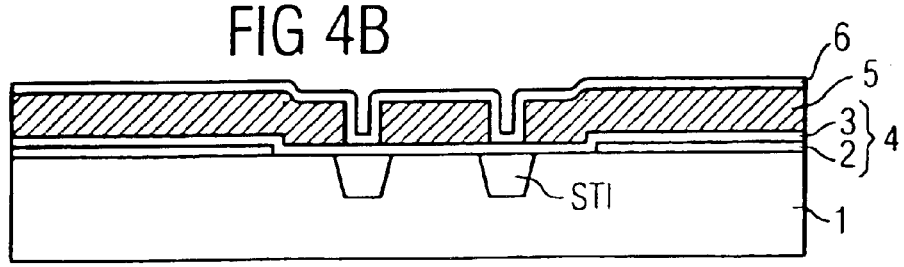

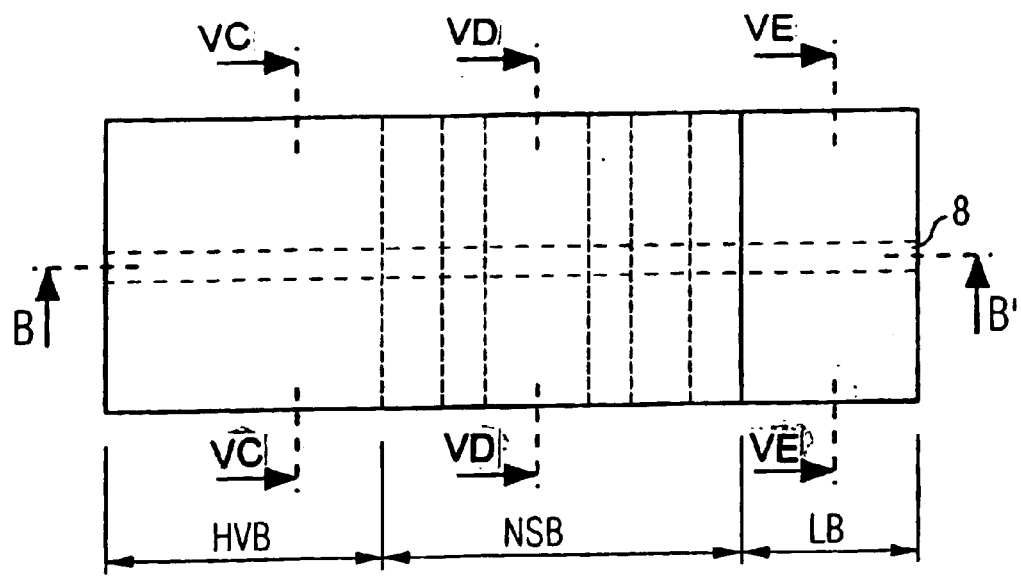
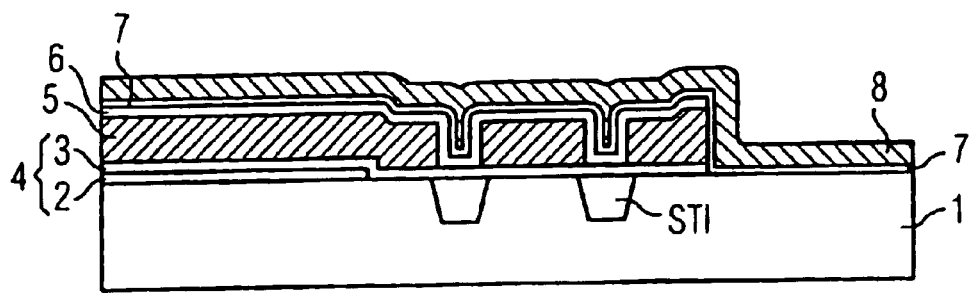

METHOD FOR FABRICATING EMBEDDED NONVOLATILE SEMICONDUCTOR MEMORY CELLS

BACKGROUND OF THE INVENTION

Field of the Invention

The present invention relates to a method for fabricating embedded nonvolatile semiconductor memory cells and, in particular, to a method for fabricating nonvolatile memory cells in a semiconductor circuit with at least a high-voltage region and a logic region.

In order to fabricate embedded or so-called nonvolatile semiconductor cells in semiconductor circuits which have, for example, a logic part and a high-voltage part, different types of transistors are required in the respective circuit parts or regions in order to satisfy the various requirements, some of which conflict. By way of example, transistors in a nonvolatile memory region must have a tunnel layer, a charge-storing layer, a coupling layer and a control layer in order to realize so-called single-transistor or multi-transistor memory cells. In contrast, transistors in a logic part or logic region contain only a gate oxide layer and a control layer, so that the charge-storing layer and the coupling layer have to be stripped off again at least in the logic region.

Such partial stripping-off of the coupling layer is problematic particularly in a logic region since submicron-scale structures can be patterned wet-chemically only with extreme difficulty, if at all. When dry etching processes are used, however, a single crystal of a substrate used is disturbed by incorporation of dislocations and impurity atoms in the critical topmost layer, as a result of which problems arise particularly in the formation of a subsequent gate oxide layer. More precisely, these defects lead to weak points in the gate oxide layer.

However, extremely stringent requirements are imposed particularly on the reliability of layers in the logic region with regard to a breakdown strength, since they crucially influence the electrical properties of the semiconductor circuit.

SUMMARY OF THE INVENTION

It is accordingly an object of the invention to provide a method for fabricating embedded nonvolatile semiconductor memory cells which overcomes the above-mentioned disadvantages of the prior art methods of this general type, which improves the reliability of the circuit at least in a logic region.

With the foregoing and other objects in view there is provided, in accordance with the invention, a method for fabricating embedded nonvolatile semiconductor memory cells. The method includes the steps of providing a substrate divided into a high-voltage region, a memory region and a logic region; forming a first insulating layer on the substrate in the high-voltage region, the memory region and the logic region; removing the first insulating layer in the memory region; forming a second insulating layer in the high-voltage region, the memory region and the logic region; forming a charge storing layer in the high-voltage region, the memory region and the logic region; patterning the charge-storing layer in the memory region; forming a third insulating layer in the high-voltage region, the memory region and the logic region; removing the first to third insulating layers and also the charge-storing layer in the logic region; forming a fourth insulating layer in the high-voltage region, the memory region and the logic region; and forming and patterning a conductive control layer in the high-voltage region, the memory region and the logic region.

In this case, it is preferable for the charge-storing layer to be patterned and then the third insulating layer to be formed in a whole-area manner thereon, as a result of which an improved sidewall isolation is produced for the charge-storing layer elements and the charge retention times can be improved.

The first insulating layer preferably contains an oxide layer that has a thickness of 20 to 25 nm and on which a tunnel oxide layer having a thickness of approximately 7 to 10 nm is formed thermally. In this case, the first and second insulating layers together produce a high-voltage oxide layer for the switching elements or transistors located in a high-voltage region.

The charge-storing layer contains an electrically conductive or an electrically nonconductive layer, thereby enabling different types of nonvolatile semiconductor cells to be realized.

An ONO layer sequence is preferably formed as the third insulating layer, the layer sequence realizing outstanding coupling properties combined with ease of fabrication.

Dry etching is preferably carried out for removing the third insulating layer and the charge-storing layer. In contrast, wet-chemical etching is carried out for removing the first and second insulating layers, as a result of which a high-quality substrate surface can be uncovered in a simple and cost-effective manner particularly in the logic region.

As the fourth insulating layer, a gate oxide layer is either formed thermally or deposited using conventional methods, thereby obtaining the requisite reliability of the insulating layer or the logic part with regard to breakdown strength.

In accordance with an added mode of the invention, there is the step of using a hard mask during the steps of forming and patterning the conductive control layer.

Other features which are considered as characteristic for the invention are set forth in the appended claims.

Although the invention is illustrated and described herein as embodied in a method for fabricating embedded nonvolatile semiconductor memory cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3A is a plan view of the semiconductor circuit for illustrating fabrication steps in accordance with the first exemplary embodiment;

FIG. 3B is a sectional view of the semiconductor circuit for illustrating fabrication steps in accordance with the first exemplary embodiment;

FIG. 4A is a plan view of the semiconductor circuit for illustrating fabrication steps in accordance with the first exemplary embodiment;

FIG. 4B is a sectional view of the semiconductor circuit for illustrating fabrication steps in accordance with the first exemplary embodiment;

FIG. 5A is a plan view of the semiconductor circuit for illustrating further fabrication steps in accordance with the first exemplary embodiment;

FIG. 5B is a sectional view of the semiconductor circuit for illustrating further fabrication steps in accordance with the first exemplary embodiment.

DESCRIPTION OF THE PREFERRED EMBODIMENTS

Figure 1A:
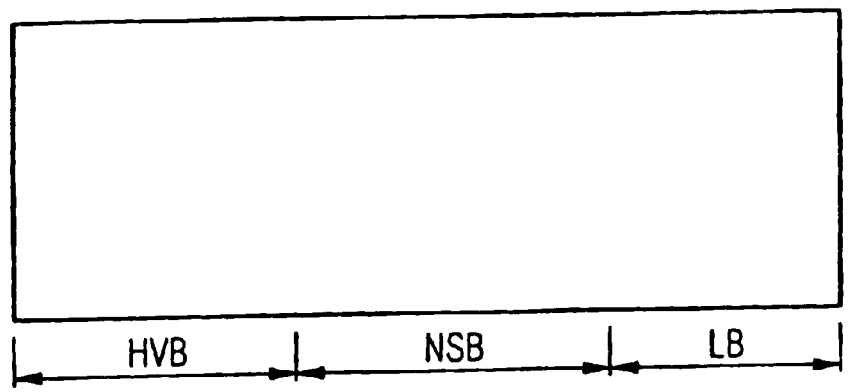
FIG. 1A is a diagrammatic, plan view of a semiconductor circuit for illustrating fabrication steps in accordance with a first exemplary embodiment according to the invention.
Figure 1B:
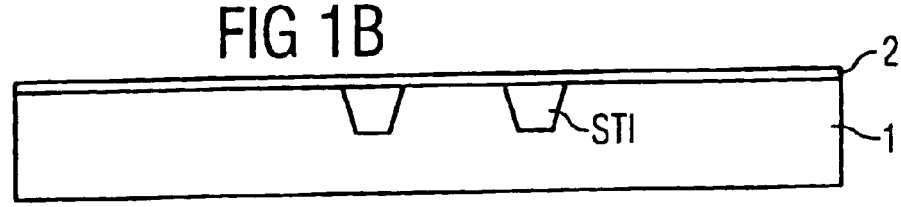
FIG. 1B is a sectional view of the semiconductor circuit for illustrating fabrication steps in accordance with the first exemplary embodiment.

Referring now to the figures of the drawing in detail and first, particularly, to FIGS. 1A and 1B thereof, there is shown a respective plan view and a sectional view of a semiconductor circuit with a high-voltage region HVB, a nonvolatile memory region NSB and a logic region LB. In accordance with the invention, nonvolatile semiconductor memory cells are accordingly intended to be formed in the nonvolatile memory region NSB, the intention being simultaneously to form corresponding switching elements of high-voltage transistors and logic transistors in the respectively high-voltage and logic regions HVB and LB. Since, as has already been discussed in the introduction, the switching elements have to satisfy requirements that differ and often even conflict, the description below describes a particularly advantageous processing in particular for the purpose of realizing so-called embedded nonvolatile semiconductor memory cells. In this case, the invention essentially relates to the formation of first layers on a substrate, for which reason the processing for forming active regions and different doped wells in the substrate and also the formation of "upper" layer sequences are not discussed in any further detail below.

In accordance with FIG. 1B, after the formation of active regions for example by shallow trench isolation (STI), in the nonvolatile memory region NSB, a first insulating layer 2 is formed on a substrate 1, which constitutes a silicon semiconductor substrate 1 for example. The first insulating layer 2 may be formed by a deposition method, for example, and preferably is formed as a silicon oxide layer having a thickness of 20 to 25 nm. As an alternative, however, it is also possible to thermally oxidize the substrate.

Figure 2A:
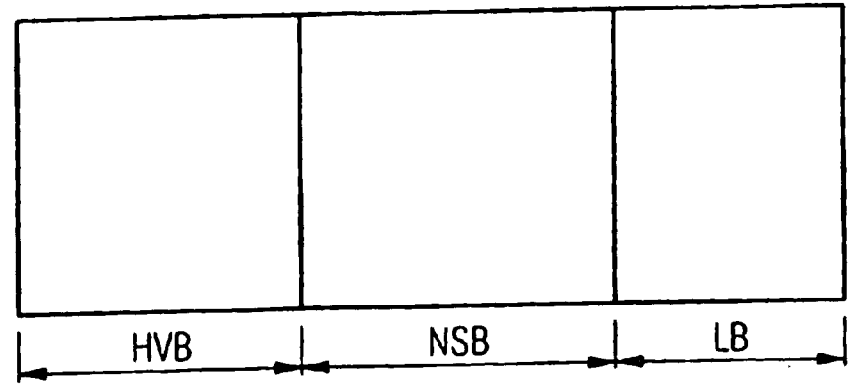
FIG. 2A is a plan view of the semiconductor circuit for illustrating fabrication steps in accordance with the first exemplary embodiment.
Figure 2B:
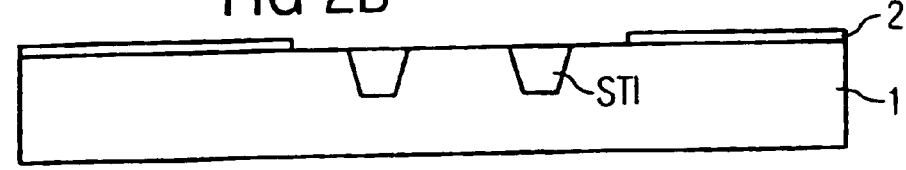
FIG. 2B is a sectional view of the semiconductor circuit for illustrating fabrication steps in accordance with the first exemplary embodiment.

In accordance with FIG. 2A and FIG. 2B, in a subsequent fabrication step, the first insulating layer 2 is locally removed from the nonvolatile memory region NSB. The patterning is carried out for example using a non-illustrated lithographic mask, wet-chemical or dry-chemical processes being used to remove the first insulting layer 2 with subsequent resist stripping. The formation of possibly required wells and other doping regions in the respective regions of the semiconductor circuit is explicitly dispensed with at this point since this involves steps that are not essential to the invention.

In accordance with FIGS. 3A and 3B, a second insulating layer 3 is formed over the whole area. By way of example, the second insulating layer 3 is formed thermally in a furnace process or by a rapid thermal process (RTP), a tunnel oxide layer 3 having a thickness of approximately 7 to 10 nm preferably being formed as a result. In the nonvolatile memory region NSB, the tunnel oxide layer 3 is used as a tunnel layer 3 for the respective nonvolatile semiconductor memory cells, whereas, particularly in the high-voltage region HVB, together with the first insulating layer 2, it forms a high-voltage oxide layer 4 approximately having a thickness of 25 to 35 nm. In this case, the reduced thickness essentially results from the reduced oxide growth on the first insulating layer 2.

In a further fabrication step in accordance with FIGS. 4A and 4B, there then takes place whole-area formation and patterning of a charge-storing layer 5 with a third insulating layer 6, in which case, in accordance with a first exemplary embodiment illustrated in FIG. 4B, the charge-storing layer 5 is deposited over the whole area for example as a highly doped (in-situ) polysilicon layer and is then patterned in the vertical direction for example above the trench isolation STI. In a subsequent step, the third insulating layer 6 is formed over the whole area, which layer may contain for example an oxide-nitride-oxide (ONO) layer sequence. Particularly in the nonvolatile memory region NSB, the third insulating layer 6 serves as a coupling layer 6 and is also referred to as a coupling oxide layer 6. Particularly on account of the exclusive patterning of the charge-storing layer 5 with subsequent formation of the third insulating layer 6, the sidewalls of the charge-storing layers 5, formed in a strip-type manner, can be insulated particularly well, which has a favorable effect on the charge retention capability of memory cells.

As an alternative to the conductive charge-storing layer 5 described above, a nonconductive charge-storing layer can also be used in the same way, as a result of which the charge retention properties of nonvolatile semiconductor memory cells can be improved further.

In the same way, instead of the oxide-nitride-oxide (ONO) layer sequence 6, for the third insulating layer 6, it is possible to use a different dielectric as a coupling layer, in particular layers having a high relative permittivity promoting a reduction of read/write voltages in the nonvolatile memory region NSB. In this case, programming is affected preferably via Fowler-Nordheim tunneling or injection of hot charge carriers through the second insulating layer 3 or tunnel oxide layer.

In a further fabrication step in accordance with FIGS. 5A and 5B, the first to third insulating layers 2, 3 and 6 and also the charge-storing layer 5 are then removed locally from the logic region LB. In this case, it is preferably to carry out dry-chemical etching of the third insulating layer 6 and of the charge-storing layer 5, which, for example, may also be effected jointly or simultaneously with the patterning of the charge-storing layer 5 and/or of the third insulating layer 6 in the nonvolatile memory part NSB in accordance with FIGS. 4A and 4B. As an alternative, however, wet-chemical etching of the logic region LB can also be carried out.

Afterward, for example using a wet-chemical etching operation, the high-voltage oxide layer 4 containing the first and second insulating layers 2, 3 is removed in the logic region, buffered or dilute hydrofluoric acid (HF) preferably being used. In this way, the previously applied layers are removed down to the surface of the substrate 1 in a large-area manner and relatively gently, a very good substrate surface without dislocations and impurity atoms being obtained.

On the basis of this very good substrate surface with a very small number of defects, a fourth insulating layer 7 can be formed over the whole area in a subsequent process step, which insulating layer, particularly in the logic region, fully satisfies the high demands—made with regard to breakdown strength—with regard to reliability. By way of example, the fourth insulating layer 7 is formed thermally as a gate oxide layer ($SiO_2$) by a furnace process or RTP method. However, it can also be deposited from the vapor phase.

Finally, a conductive control layer 8 is formed in a subsequent fabrication step, an electrically conductive polysilicon layer, for example, being deposited and patterned by a TEOS hard mask, for example. As an alternative, however, undoped polysilicon can also be deposited and subsequently implanted or a metallic layer can be deposited as the control layer 8. Preferably, during the patterning of the control layer 8, in the nonvolatile memory region NSB, the coupling layer or the third insulating layer 6 as well as the charge-storing layer 5 are also patterned simultaneously, thereby producing island-type charge-storing layer regions or nonvolatile semiconductor memory cells. In the same way, corresponding switching transistors can also be formed in the high-voltage HVB.

Figure 5C:
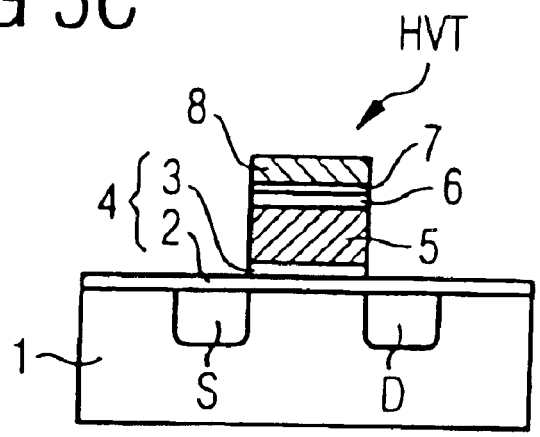
FIGS. 5C to 5E are respective sectional views taken along lines VC—VC, VD—VD and VE—VE shown in FIG. 5A.

FIG. 5C shows a simplified sectional view in accordance with a section VC—VC from FIG. 5A in the high-voltage region HVB, a high-voltage transistor HVT now containing a stack formed by the control layer 8, the fourth and third insulating layers 7 and 6, the charge-storing layer 5 and the high-voltage oxide layer 4. The charge-storing layer 5 can preferably be removed in a previous step or be short-circuited with the control layer 8. Source regions S and drain regions D can be formed at this point in time, for example, in a self-aligning manner in the substrate 1. However, they can also be formed at a later or earlier point in time by different methods.

Figure 5D:
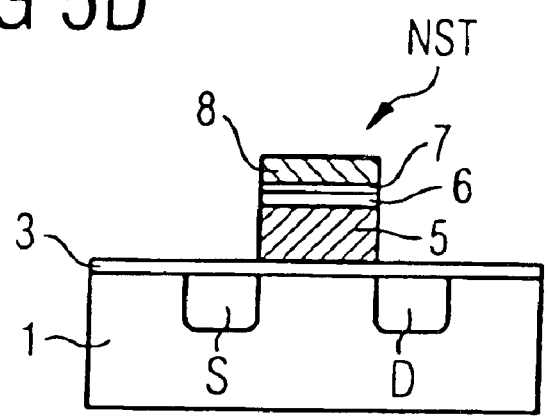

FIG. 5D shows a sectional view in accordance with a section VD—VD shown in FIG. 5A, a nonvolatile memory transistor NST again containing the control layer 8, the third and fourth insulating layers 6 and 7, the charge-storing layer 5 and the tunnel oxide layer or second insulating layer 3. Corresponding source regions S and drain regions D can again be formed in a self-aligning manner by ion implantation, for example, in the substrate 1.

Figure 5E:
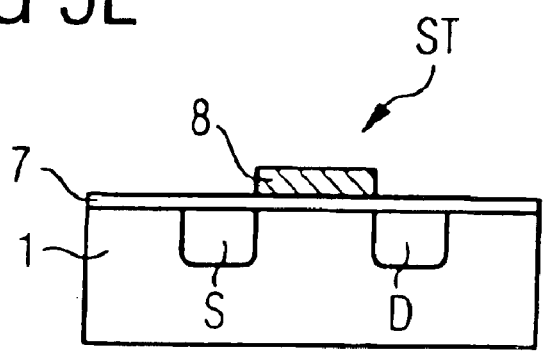

FIG. 5E shows a simplified sectional view along a section VE—VE in accordance with FIG. 5A in the logic region LB, a switching transistor ST having only the control layer 8 and an extremely high-quality gate oxide layer as the fourth insulating layer 7.

Accordingly, the fabrication method described above can be used to fabricate in particular embedded nonvolatile semiconductor memory cells or transistors NST in a nonvolatile memory region NSB in a simple and cost-effective manner, at the same time in particular the electrical properties of switching transistors ST in the corresponding logic regions LB is not impaired. The insulating layers which are required for the respective characteristic properties and lie directly on the substrate 1 can thus be fabricated in a simple and cost-effective manner with high quality in an identical method.

The invention has been described above using silicon semiconductor substrates. However, it is not restricted thereto and includes alternative substrate materials in the same way. In the same way, the invention is not restricted to the silicon dioxide, polysilicon and ONO layers described, but rather includes alternative materials in the same way.

We claim:

1. A method for fabricating embedded nonvolatile semiconductor memory cells, which comprises the steps of:

providing a substrate divided into a high-voltage region, a memory region and a logic region;

forming a first insulating layer on the substrate in the high-voltage region, the memory region and the logic region;

removing the first insulating layer in the memory region;

forming a second insulating layer in the high-voltage region, the memory region and the logic region;

forming a charge storing layer in the high-voltage region, the memory region and the logic region;

patterning the charge-storing layer in the memory region;

forming a third insulating layer in the high-voltage region, the memory region and the logic region;

removing the first to third insulating layers and also the charge-storing layer in the logic region;

forming a fourth insulating layer in the high-voltage region, the memory region and the logic region; and forming and patterning a conductive control layer in the high-voltage region, the memory region and the logic region.

2. The method according to claim 1, which comprises forming the first insulating layer by depositing an oxide layer having a thickness of 20 to 25 nm.

3. The method according to claim 1, which comprises thermally forming the second insulating layer as a tunnel oxide layer having a thickness of approximately 7 to 10 nm.

4. The method according to claim 1, which comprises forming a high-voltage oxide layer from the first and second insulating layers.

5. The method according to claim 1, which comprises forming the charge-storing layer as one of an electrically conductive layer and a nonconductive layer.

6. The method according to claim 1, which comprises forming the third insulating layer as an oxide-nitride-oxide layer sequence.

7. The method according to claim 1, which comprises during the second removing step, carrying out a dry etching step for removing the third insulating layer and the charge-storing layer.

8. The method according to claim 1, which comprises during the second removing step, carrying out a wet-chemical etching for removing the first and second insulating layers.

9. The method according to claim 1, which comprises forming the fourth insulating layer as a gate oxide layer by one of depositing the gate oxide layer and thermally forming the gate oxide layer.

10. The method according to claim 1, which comprises using a hard mask during the steps of forming and patterning the conductive control layer.

* * * * *